(12) United States Patent
Pettersen

(10) Patent No.: US 6,480,052 B1
(45) Date of Patent: Nov. 12, 2002

(54) PARASITIC CAPACITANCE CANCELING CIRCUIT

(75) Inventor: Fred-Johan Pettersen, Cork (IE)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/772,718

(22) Filed: Jan. 30, 2001

(51) Int. Cl.⁷ .............................................. H03K 17/16
(52) U.S. Cl. ....................................... 327/382; 327/493
(58) Field of Search ................................. 327/382, 564, 327/565, 493, 583

(56) References Cited

U.S. PATENT DOCUMENTS 5,559,667 A * 9/1996 Evans ......................... 361/526
5,733,309 A * 3/1998 Kroll et al. ..................... 607/5
6,317,378 B1 * 11/2001 Savignac et al. ........... 365/226

* cited by examiner

*Primary Examiner*—Tuan T. Lam
(74) *Attorney, Agent, or Firm*—Christopher P. Maiorana, P.C.; John J. Ignatowski

(57) ABSTRACT

A circuit than may be used in an integrated circuit capacitor design. The circuit generally comprises a multilayer capacitor and a buffer. The multilayer capacitor may be configured as (i) a first capacitance, (ii) a second capacitance, and (iii) a third capacitance in series between the first capacitance and the second capacitance. The buffer may be configured to maintain a constant voltage across the third capacitance to isolate the first capacitance from the second capacitance.

14 Claims, 5 Drawing Sheets

PARASITIC CAPACITANCE CANCELING CIRCUIT

FIELD OF THE INVENTION

The present invention relates to a method and/or architecture for a capacitor designed into an integrated circuit generally and, more particularly, to a method and/or architecture for reducing or eliminating effects of a parasitic capacitor related to the capacitor.

BACKGROUND OF THE INVENTION

Integrated circuit designs may use multiple conductive layers to form parallel plate capacitors isolated from a substrate. One design approach is to form an intended capacitor using two conductive layers used in the integrated circuit design process. For example, a polysilicon layer may be used to for a bottom plate and a metal layer may be used to for a top plate of the intended capacitor. Where three or more conductive layers are available, the capacitance can be increased by interconnecting every other layer of the multiple conductive layers.

A problem with parallel plate capacitor designs in integrated circuits is that a parasitic capacitance is formed between the substrate and the nearest conductive layer. The parasitic capacitance causes unwanted effects in the intended capacitor. For example, the parasitic capacitance may introduce noise pickup from the substrate into the intended capacitor. In another example, the parasitic capacitance can increase an effective capacitive load of the intended capacitor thus leading to unwanted attenuation of a signal.

SUMMARY OF THE INVENTION

The present invention concerns a circuit than may be used in an integrated circuit capacitor design. The circuit generally comprises a multilayer capacitor and a buffer. The multilayer capacitor may be configured as (i) a first capacitance, (ii) a second capacitance, and (iii) a third capacitance in series between the first capacitance and the second capacitance. The buffer may be configured to maintain a constant voltage across the third capacitance to isolate the first capacitance from the second capacitance.

The objects, features and advantages of the present invention include providing a method and/or architecture for implementing an integrated circuit capacitor that may (i) reduce the effects of a parasitic capacitance, (ii) reduce noise coupling from a substrate, and/or (iii) reduce signal attenuation.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
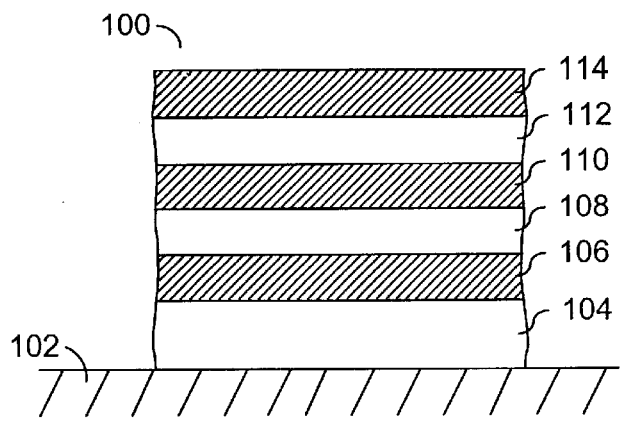
FIG. 1 is a cross-sectional view of a multilayer capacitor.

Referring to FIG. 1, a cross-sectional view of a multilayer capacitor 100 is shown in accordance with a preferred embodiment of the present invention. The multilayer capacitor 100 generally comprises a substrate 102 and multiple conductive layers separated by multiple isolating layers. A bottom insulating layer 104 may be provided overlaying the substrate 102. A bottom conductive layer 106 may be provided overlaying the bottom insulating layer 104. A middle insulating layer 108 may be provided overlaying the bottom conductive layer 106. A middle conductive layer 110 may be provided overlaying the middle insulating layer 108. A top insulating layer 112 may be provided overlaying the middle conductive layer 110. A top conductive layer 114 may be provided overlaying the top insulating layer 112.

Figure 2:
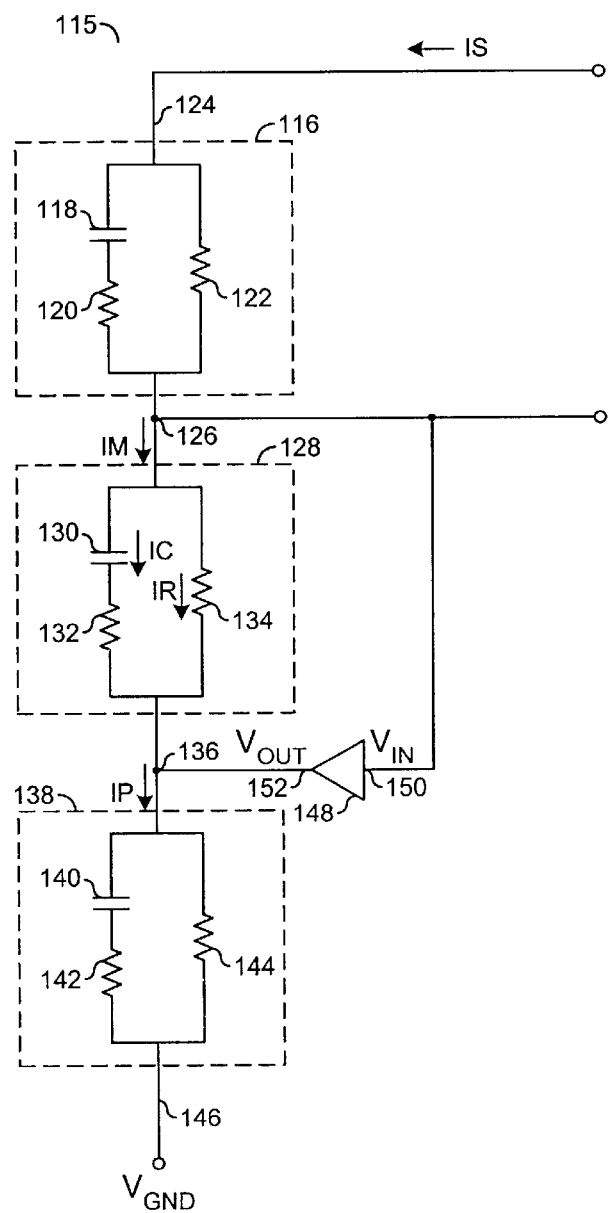
FIG. 2 is a schematic of a circuit incorporating the multilayer capacitor.

Referring to FIG. 2, a schematic of a circuit 115 incorporating the multilayer capacitor 100 is shown. The top conductive layer 114, top insulating layer 112, and middle conductive layer 110 generally form a capacitor 116 hereinafter referred to as an intended capacitor 116. The intended capacitor 116 may be a capacitor having an intended or desired capacitance needed for a design implemented by the circuit 115. The intended capacitor 116 may be modeled as an intended capacitance 118, a series resistance 120, and a parallel resistance 122. The intended capacitor 116 may have an independent node 124 generally formed in the top conductive layer 114. The intended capacitor 116 may have a common node 126 generally formed in the middle conductive layer 110.

The middle conductive layer 110, middle insulating layer 108, and bottom conductive layer 106 generally form a capacitor 128 hereinafter referred to as a sacrifice capacitor 128. The sacrifice capacitor 128 may have a capacitance that is electrically "sacrificed" or neutralized to isolate the intended capacitor 116. The sacrifice capacitor 128 may be modeled as a sacrifice capacitance 130, a series resistance 132, and a parallel resistance 134. The sacrifice capacitor 128 may share the common node 126 with the intended capacitor 116. The sacrifice capacitor 128 may have another common node 136 generally formed in the bottom conductive layer 106.

The bottom conductive layer 106, the bottom insulating layer 104 and the substrate 102 may form a capacitor 138 hereinafter referred to as a parasitic capacitor 138. The parasitic capacitor 138 is generally an unwanted capacitor formed in the design of the multilayer capacitor 100. The parasitic capacitor 138 may be modeled as a parasitic capacitance 140, a series resistance 142, and a parallel resistance 144. The parasitic capacitor 138 may share the common node 136 with the sacrifice capacitor 128. The parasitic capacitance 138 may have a node 146 generally formed by the substrate 102.

A signal (e.g., $I_S$) applied to the intended capacitor 116 may be electrically isolated from the parasitic capacitor 138 by the sacrifice capacitor 128 using a buffer 148. The signal $I_S$ may be implemented as a current. The buffer 148 generally has a small signal unity gain that may or may not include a direct-current (DC) voltage offset. The buffer 148 may have an input 150 connected to the common node 126. The buffer 148 may have an output 152 connected to the common node 136.

The buffer 148 generally senses an input signal (e.g., $V_{IN}$) at the common node 126. The input signal $V_{IN}$ may be implemented as an input voltage. The buffer 148 then performs a unity gain amplification of the input signal $V_{IN}$ to create an output signal (e.g., $V_{OUT}$). The output signal $V_{OUT}$ may be implemented as an output voltage. The output signal $V_{OUT}$ may be presented to the common node 136. If a difference between the input signal $V_{IN}$ and the output signal $V_{OUT}$ is a constant, then a signal (e.g., $I_C$) through the sacrifice capacitance 130 and the series resistance 132 will approach zero amperes. The signal $I_C$ may be a current. If the output signal $V_{OUT}$ matches the input signal $V_{IN}$, then another signal (e.g., $I_R$) through the parallel resistor 134 will approach zero amperes. The signal $I_R$ may be a resistive leakage current.

A signal (e.g., $I_M$) in the sacrifice capacitor 128 may be a sum of the signal $I_C$ and the signal $I_R$. The signal $I_M$ may be implemented as a current. Minimizing or eliminating the signal $I_M$ may minimize or eliminate an impact the signal $I_M$ has on the signal $I_S$ through the intended capacitor 116. The signal $I_M$ may be minimized by reducing or eliminating the signal $I_C$ and the signal $I_R$. The buffer 148 may eliminate the signal $I_C$ by maintaining a constant voltage across the sacrifice capacitance 130. The buffer 148 may eliminate the signal $I_R$ by maintaining zero volts across the parallel resistor 134.

Reducing the signal $I_M$ to or near zero amperes effectively isolates the signal $I_S$ from the effects of the parasitic capacitor 138. A signal (e.g., $I_P$) flowing through the parasitic capacitor 138 is generally received from the buffer 148 and the sacrifice capacitor 128. The signal $I_P$ may be a parasitic leakage current. Since the signal $I_M$ may be near or at zero amperes, then the signal $I_P$ may be received only from the buffer 148. Consequently, the signal $I_P$ has no effect on the signal $I_S$.

Figure 3:
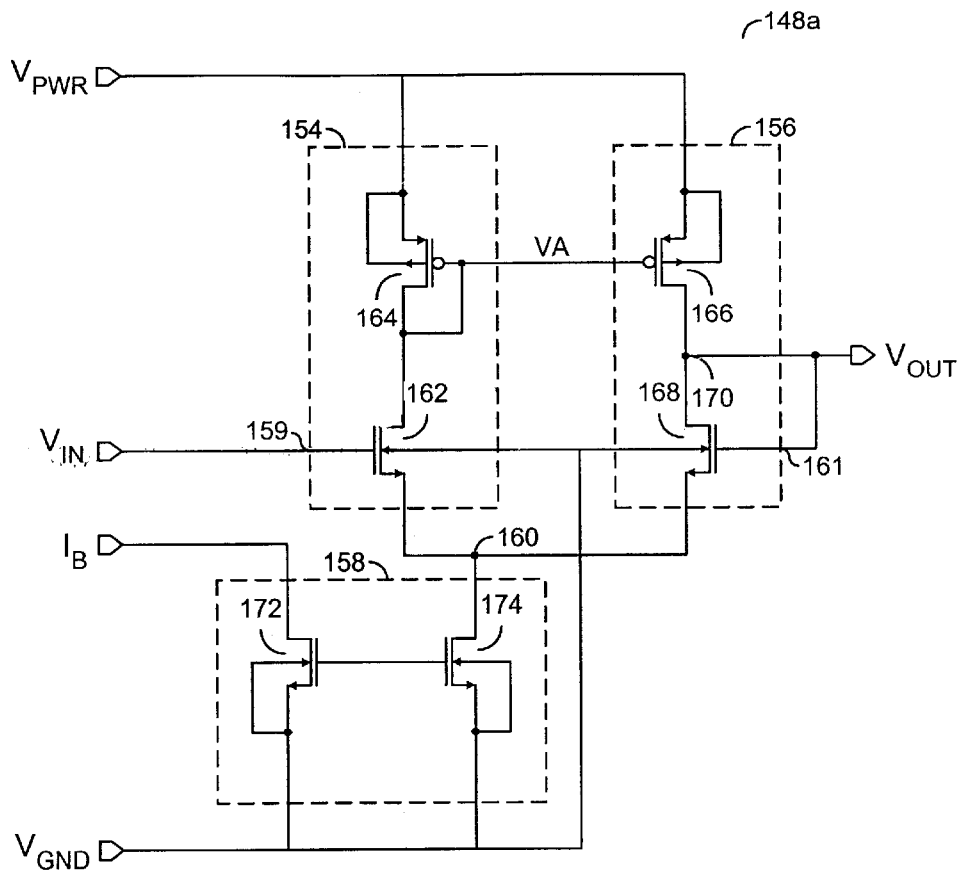
FIG. 3 is a schematic of a differential unity-gain buffer.

Referring to FIG. 3, a schematic of a differential unity-gain buffer 148A is shown. The differential unity-gain buffer 148A generally comprises a pair of inverters 154–156 and a current mirror 158. The current mirror 158 generally implements a constant current circuit for biasing the inverters 154–156.

The inverter 154 may have an input 159 for receiving the signal $V_{IN}$. The input 159 may act as a non-inverting input for the differential unit-gain buffer 148A. The inverter 154 may have an output for presenting a signal (e.g., $V_A$) to the inverter 156. The signal $V_A$ may be implemented as a voltage. The inverter 156 may have an input for receiving the signal $V_A$. The inverter 156 may have an output for presenting the signal $V_{OUT}$. The signal $V_{OUT}$ may be presented to another input 161 of the inverter 156. The input 161 may act as an inverting input for the differential unity-gain buffer 148A. The current mirror 158 may have an input for receiving a bias signal (e.g., $I_B$). The inverter 154, the inverter 156, and the current mirror 158 generally share a common node 160.

The inverter 154 generally comprises a transistor 162 in series with a transistor 164. The transistor 162 may receive the signal $V_{IN}$ at a gate. The inverter 156 generally comprises a transistor 166 in series with a transistor 168. The signal $V_{OUT}$ may be presented from a node 170 connecting the transistor 166 and the transistor 168. The current mirror 158 generally comprises a transistor 172 in parallel with another transistor 174. The transistor 172 may receive the signal $I_B$ at a source and a gate. The transistor 174 may receive the signal $I_B$ at a gate. The transistor 162, the transistor 168, and the transistor 174 may share the node 160.

The differential unity-gain buffer 148A generally amplifies the input signal $V_{IN}$ such that the output signal $V_{OUT}$ matches the input signal $V_{IN}$. As a result, the difference between the input signal $V_{IN}$ and the output signal $V_{OUT}$ is a constant of zero volts. When the output signal $V_{OUT}$ signal is applied to the common node 136, the signal $I_C$ and the signal $I_R$ generally approach zero.

Figure 4:
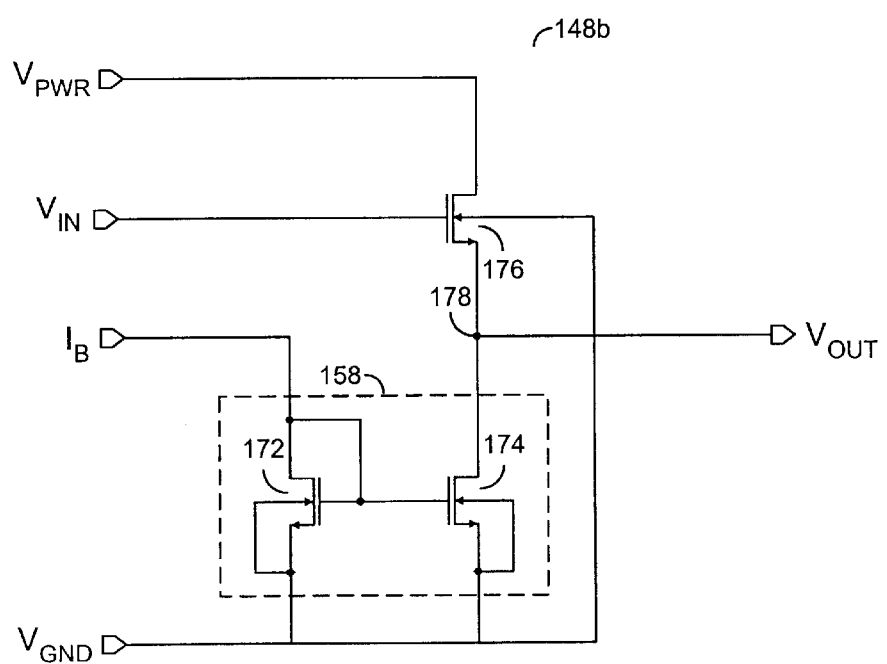
FIG. 4 is a schematic of a source follower unity-gain buffer.

Referring to FIG. 4, a schematic of a source follower unity-gain buffer 148B is shown. The source follower unity-gain buffer 148B generally comprises a transistor 176 in series with the current mirror 158. The transistor 176 may have an input for receiving the signal $V_{IN}$ at a gate. The signal $V_{OUT}$ may be presented from a node 178 connecting the transistor 176 and the current mirror 158.

The source follower unity-gain buffer 148B generally amplifies the input signal $V_{IN}$ such that the output signal $V_{OUT}$ is approximately equal to the input signal $V_{IN}$ plus a non-zero constant. The non-zero constant may be implemented as a positive or a negative voltage with respect to the common node 126. When the output signal $V_{OUT}$ is applied to the common node 136, the signal $I_C$ generally approaches zero while the signal $I_R$ remains. If the signal $I_R$ can be kept sufficiently small, then the signal $I_R$ may have no consequential impact on the signal $I_S$ through the intended capacitor 116.

Figure 5:
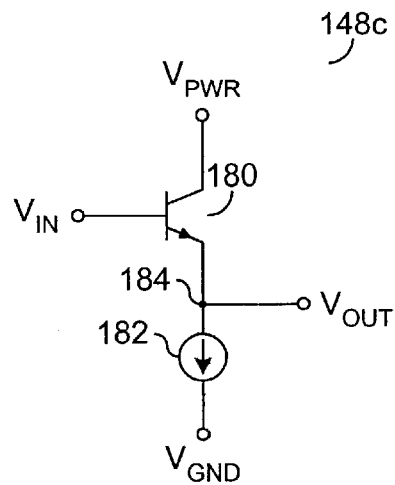
FIG. 5 is a schematic of an emitter follower unity-gain buffer.

Referring to FIG. 5, a schematic of an emitter follower unity-gain buffer 148C is shown. The emitter follower unity-gain buffer 148C generally comprises a transistor 180 in series with a constant current circuit 182. The transistor 180 may have an input for receiving the signal $V_{IN}$ at a base. The signal $V_{OUT}$ may be presented from a node 184 connecting the transistor 180 and the constant current circuit 182. In operation, the emitter follower unity-gain buffer 148C performs similarly to the source follower unity-gain buffer 148B. The emitter follower unity-gain buffer 148C generally produces a non-zero constant voltage across the sacrifice capacitor 128.

Figure 6:
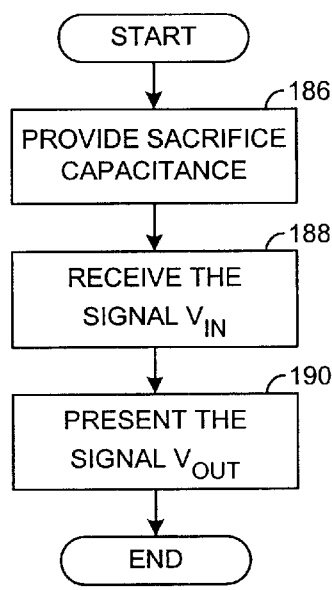
FIG. 6 is a flow diagram of a method of operating the circuit.

Referring to FIG. 6, a flow diagram of a method of operating the circuit 115 is shown. The sacrifice capacitance 130 is generally provided between the intended capacitance 118 and the parasitic capacitance 140 (e.g., block 186). The buffer 148 may then receive the signal $V_{IN}$ from the common node 126. (e.g., block 188). The buffer 148 may then present the signal $V_{OUT}$ to the common node 136 (e.g., block 190). The signal $I_C$ is generally proportional to a derivative $d(V_{OUT}-V_{IN})/dt$, therefor if $V_{OUT}$ equals $V_{IN}$ or differs from $V_{IN}$ by a constant then the signal $I_C$ may be zero amperes.

Figure 7:
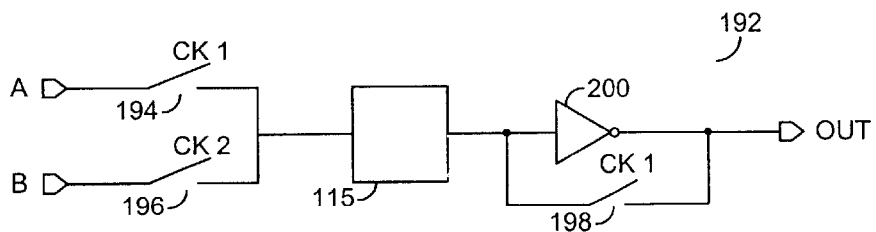
FIG. 7 is a schematic of a switched comparator implementing the present invention.

Referring to FIG. 7, a schematic of a switched comparator 192 implementing the present invention is shown. The switched comparator 192 may compare two signals (e.g., A and B) and presents a signal (e.g., OUT) as a result of the comparison. The switched comparator 192 generally comprises three switches 194, 196 and 198, an inverter 200, and the circuit 115. The switches 194 and 198 may be controlled by a signal (e.g., CK1). The switch 196 may be controlled by another signal (e.g., CK2). The signals CK1 and CK2 may be implemented as non-overlapping clock signals.

The switches 194 and 196 generally connect the signals A and B respectively to the circuit 115. In particular, the signals A and B may be presented to the node 124 of the intended capacitor 116. The switch 198 may connect the signal OUT to an input of the inverter 200. The circuit 115 may present a signal (e.g., $V_X$) to the input of the inverter 200. The signal $V_X$ may be presented on the common node 126 between the intended capacitor 116 and the sacrifice capacitor 128.

When the signal CK1 is active, the inverter 200 generally holds the signal $V_X$ at a trip-point (e.g., $V_T$) for the inverter 200. The signal A may charge the intended capacitor 116 to a voltage equal to the difference between signal A and the signal $V_X$. When the signal CK2 is active, the switch 198 may open leaving the signal $V_X$ on a high impedance line. Since the voltage across the intended capacitor 116 remains signal A–$V_T$, then the signal $V_X$ may be expressed as signal B—signal A+$V_T$. If the signal B is greater than signal A, then the signal $V_X$ may exceed the trip-point $V_T$ causing the signal OUT to move toward a low rail voltage. If the signal B is less than the signal A, then the signal $V_X$ may be less than the trip-point $V_T$ causing the signal OUT to more toward a high rail voltage.

Figure 8A:
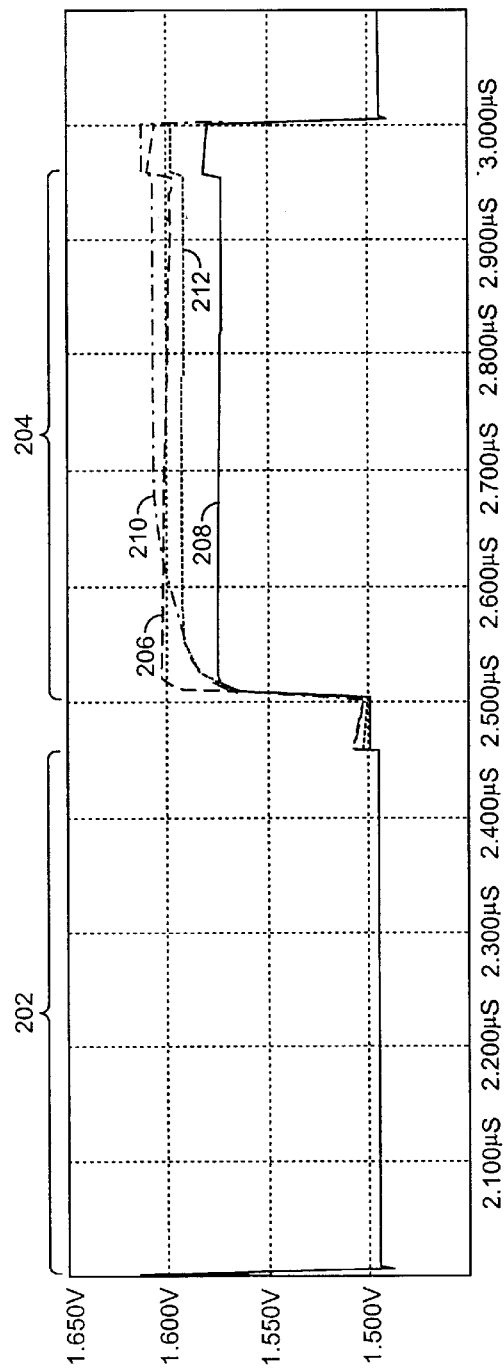
FIGS. 8A and 8B are a graph of waveforms for four variations of the switched comparator using a first set of inputs.
Figure 8B:
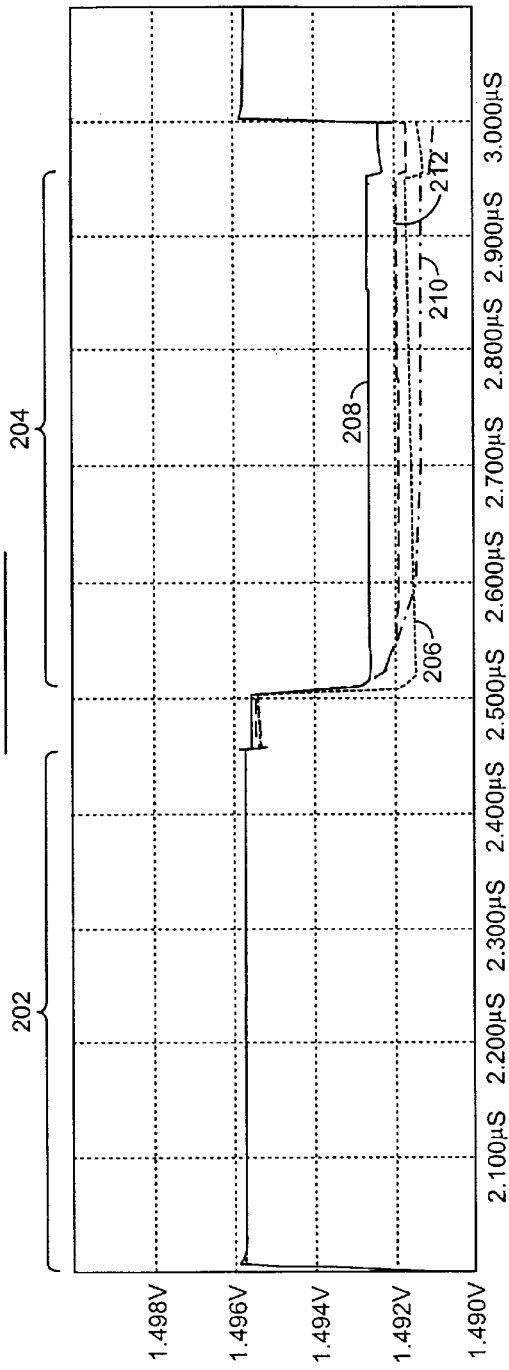

Referring to FIG. 8, a graph of waveforms for four variations of the switched comparator 192 using a first set of inputs is shown. FIG. 8A shows the waveforms of the signal OUT at the output of the inverter 200. FIG. 8B shows the waveforms of the signal $V_X$ at the input of the inverter 200. The signal CK1 is active during a first portion 202 of the waveforms. The signal CK2 is active during a second portion 204 of the waveforms. The signal A and the signal B have a 5 millivolt (mV) difference in voltage.

A first waveform 206 generally represents the circuit 115 having only the intended capacitor 116. The first waveform 206 may be an ideal case where the effects of the parasitic capacitor 138 have been eliminated. A second waveform 208 generally represents the circuit 115 without the buffer 148 and with the sacrifice capacitor 128 wired in parallel with the intended capacitor 116. A third waveform 210 generally represents the circuit 115 implementing the present invention with the differential unity-gain buffer 148A. A fourth waveform 212 generally represents the circuit 115 implementing the present invention with the source follower unity-gain buffer 148B. The waveforms of the present invention (the third waveform 210 and the fourth waveform 212) may be closer to the ideal case of the first waveform 206 than the waveforms without the present invention (the second waveform 208).

Figure 9A:
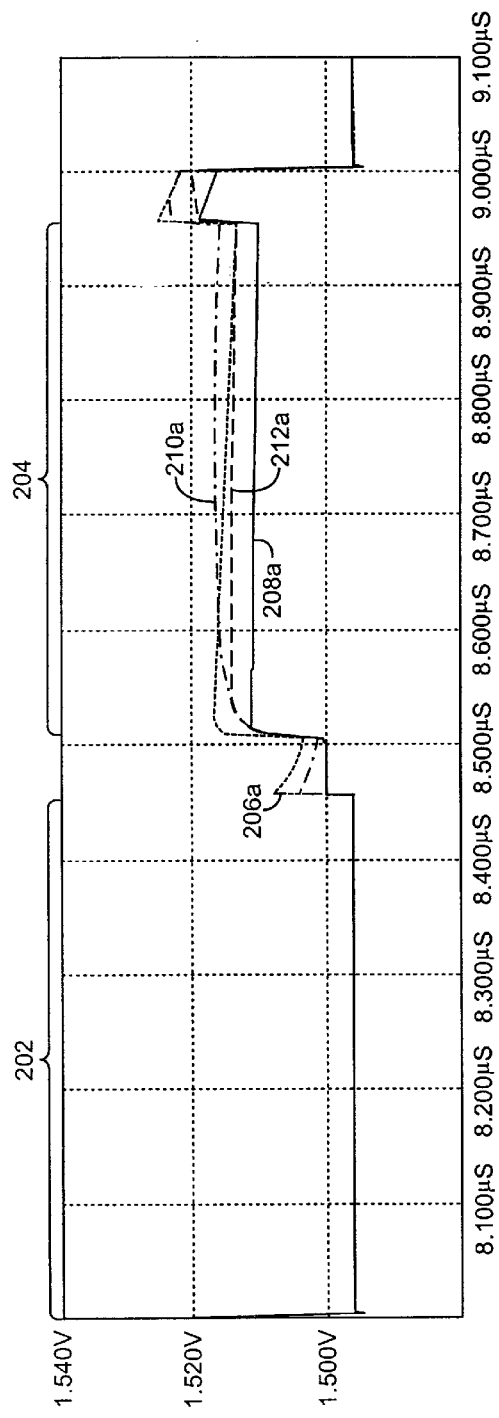
FIGS. 9A and 9B are another graph of waveforms for the four variations of the switched comparator using a second set of inputs.
Figure 9B:
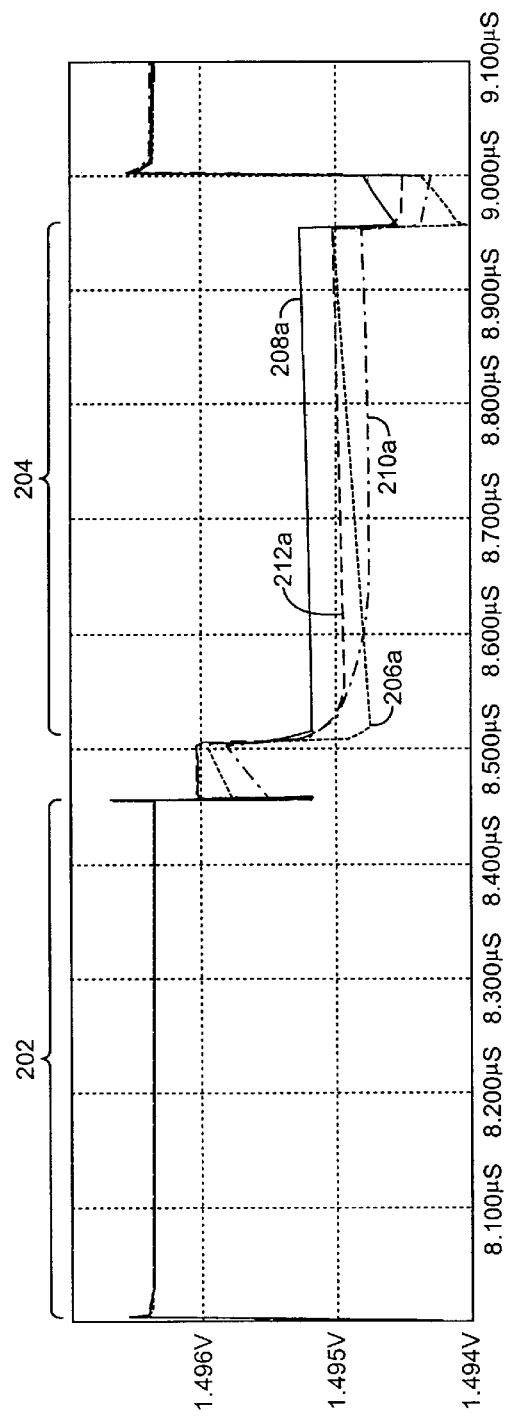

Referring to FIG. 9, a graph of waveforms for the four variations of the switched comparator 192 using a second set of inputs is shown. FIG. 9A shows the waveforms of the signal OUT at the output of the inverter 200. FIG. 9B shows the waveforms of the signal $V_X$ at the input of the inverter 200. Waveforms 206A, 208A, 210A, and 212A generally represent the same variations of the circuit 115 as the waveforms 206, 208, 210, and 212 respectively. In FIG. 9, the signal A and the signal B may have only a 1 millivolt difference in voltage. The waveforms of FIG. 9 are generally degraded as compared to the waveforms of FIG. 8. However, the third waveform 210A may still provide up to a 43% voltage improvement as compared to the signal 208A.

While the invention has been particularly shown and described with reference to the preferred embodiments thereof, it will be understood by those skilled in the art that various changes in form and details may be made without departing from the spirit and scope of the invention.

What is claimed is:

1. A circuit comprising:
   a multilayer capacitor configured as (i) a first capacitance, (ii) a second capacitance, and (iii) a third capacitance in series between said first capacitance and said second capacitance; and
   a buffer connected between (a) a first node common to said first and third capacitances and (b) a second node common to said second and third capacitances, said buffer configured to maintain a constant voltage of approximately zero volts across said third capacitance to (i) isolate said first capacitance from said second capacitance and (ii) minimize a leakage current through said third capacitance.

2. The circuit according to claim 1, wherein a voltage at said second common node is offset from a voltage at said first common node by said constant voltage.

3. The circuit according to claim 1, wherein a voltage at said second common node is approximately equal to a voltage at said first common node.

4. The circuit according to claim 1, wherein said multi-layer capacitor comprises:
   a substrate;
   a first conductive layer configured to form said second capacitance with said substrate;
   a second conductive layer configured to form said third capacitance with said first conductive layer; and
   a third conductive layer configured to form said first capacitance with said second conductive layer.

5. The circuit according to claim 4, wherein said buffer is configured to have (i) a non-inverting input connected to said second conductive layer, (ii) an output connected to said first conductive layer, and (iii) an inverting input connected to said output.

6. The circuit according to claim 5, wherein said buffer comprises a differential amplifier.

7. The circuit according to claim 6, wherein said first capacitance is an intended capacitance and said second capacitance comprises a parasitic capacitance.

8. The circuit according to claim 4, wherein said buffer is configured to have (i) an input connected to said second conductive layer, and (ii) an output connected to said first conductive layer.

9. The circuit according to claim 8, wherein said buffer comprises a source follower.

10. The circuit according to claim 8, wherein said buffer comprises an emitter follower.

11. A method for isolating a first capacitance from a second capacitance in a multilayer capacitor comprising the steps of:
    (A) providing a third capacitance between said first capacitance and said second capacitance; and
    (B) maintaining a constant voltage of approximately zero volts across said third capacitance to minimize a leakage current through said third capacitance.

12. The method according to claim 11, wherein said step (B) further comprises the sub-steps of:
    receiving an input voltage at a node common to said first capacitance and said third capacitance; and
    presenting an output voltage at another node common to said third capacitance and said second capacitance, said output voltage being offset from said input voltage by said constant voltage.

13. The method according to claim 11, further comprising the sub-steps of:
    receiving an input voltage at a node common to said first capacitance and said third capacitance; and
    presenting an output voltage at another node common to said third capacitance and said second capacitance, said output voltage being approximately equal to said input voltage.

14. A circuit comprising:

means for providing a multilayer capacitor configured as (i) a first capacitance, (ii) a second capacitance, and (iii) a third capacitance in series between said first capacitance and said second capacitance; and means for maintaining a constant voltage of approximately zero volts across said third capacitance to (i) isolate said first capacitance from said second capacitance and (ii) minimize a leakage current through said capacitance.

* * * * *